United States Patent [19]

Hunts et al.

[11] 4,157,539

[45] Jun. 5, 1979

[54] CHARGE RATE, CAPACITIVE SWITCH SYSTEM

[75] Inventors: Barney D. Hunts, Mountain Lakes; Martin Brennan, Flanders, both of N.J.

[73] Assignee: The Singer Company, New York, N.Y.

[21] Appl. No.: 732,228

[22] Filed: Oct. 14, 1976

[51] Int. Cl.² ............................................. G06F 3/02
[52] U.S. Cl. ......................... 340/365 C; 200/DIG. 1; 324/60 CD; 340/365 S
[58] Field of Search ........... 340/365 C, 365 R, 365 E, 340/365 S; 200/DIG. 1; 178/17 C; 324/60 CD, 60 C

[56] References Cited

U.S. PATENT DOCUMENTS

| | | | |
|---|---|---|---|
| 3,631,472 | 12/1971 | Lincoln | 340/365 C |
| 3,717,871 | 2/1973 | Hatano et al. | 340/365 S |
| 3,721,976 | 3/1973 | Kuijsten | 340/365 S |
| 3,778,815 | 12/1973 | Wright | 340/365 S |
| 3,931,610 | 1/1976 | Marin et al. | 340/365 C |
| 3,973,256 | 8/1976 | Stoesser et al. | 340/365 S |
| 4,001,676 | 1/1977 | Hile et al. | 324/60 CD |

*Primary Examiner*—John W. Caldwell, Sr.
*Assistant Examiner*—James J. Groody
*Attorney, Agent, or Firm*—Charles R. Lewis

[57] ABSTRACT

A plurality of capacitive switches, which are actuated by the touch of a user, are coupled to unique pairs of conductors. The conductors are sequentially actuated, or interrogated, and simultaneously coupled to a charge rate detector that compares the capacitance associated with each conductor to a reference capacitor. Storage means coupled to the output of the charge rate detector stores an indication of whether the capacitance associated with each conductor is greater or less than the reference capacitor such that the stored indications constitute a two of N code that identifies an actuated capacitive switch.

23 Claims, 11 Drawing Figures

| SWITCH | 11 | 12 | 13 | 14 | 15 | 16 |
|---|---|---|---|---|---|---|
| 101 | 1 | 1 | 1 | 0 | 0 | 0 |
| 102 | 1 | 0 | 0 | 1 | 1 | 0 |
| 103 | 0 | 1 | 0 | 1 | 0 | 1 |
| 104 | 0 | 0 | 1 | 0 | 1 | 1 |

CHARGE RATE, CAPACITIVE SWITCH SYSTEM

FIELD OF THE INVENTION

This invention relates to capacitive switches and more particularly to a system for encoding capacitive switches that is readily compatible with large scale integrated circuits.

BACKGROUND OF THE INVENTION

Capacitive switches, such as those formed by thick or thin film techniques on an insulating substrate, can be readily fabricated without moving parts to provide a reliable and economical switch. Such switches are being increasingly used on control panels for various domestic appliances such as sewing machines, microwave ovens, cooking ranges and the like and also for various industrial and commercial control systems. In many instances the capacitive switches are coupled to a large scale integrated circuit micro-processor, or to various large scale integrated circuit logic circuitry. Since large scale integrated circuits generally have only a limited number of leads which can be coupled to exterior circuitry, a problem arises when a relatively large number of switches are to be coupled to the integrated circuits. This problem can be alleviated by switch decoding systems coupled between the switches and the large scale integrated circuits that identify the actuated switches while at the same time requiring less connections to the integrated circuitry than the number of switches capable of being actuated. It is desirable that such switch decoding system be reliable and economical to fabricate. Additionally, it is desirable that such switch decoding systems be capable of distinguishing a valid actuation of a switch from spurious or unintentional switch actuations caused by noise, wiping of the switch surfaces, or the like. Further, it is also desirable that such switch decoding systems enable the simultaneous actuation of two or more switches to be readily detected.

Accordingly, an object of this invention is to provide an improved capacitive switch system.

Another object of this invention is to provide an improved capacitive switch system that can be economically fabricated from integrated circuits.

A further object of this invention is to provide an improved capacitive switch system that permits the number of switches utilized to be greater than the number of output leads needed to identify switch actuations.

A still further object of this invention is to provide an improved capacitive switch system that enables an actual switch actuation to be readily distinguished from spurious switch actuations.

Still another object of this invention is to provide an improved capacitive switch system that enables the simultaneous actuation of two or more switches to be readily detected.

SUMMARY OF THE INVENTION

Briefly described, these and other objects and features of the present invention are obtained in a capacitive switch system that includes a plurality of conductors with capacitive switches coupled between selected pairs of the conductors. Scanning means sequentially interrogate, or actuate, the conductors so that a single capacitance detector means coupled to the interrogated conductors in synchronism with the scanning means detects the capacitance associated with each conductor. Storage means coupled to the output of the capacitance detector stores an indication of the capacitance value of each of the interrogated conductors such that the stored indications constitute a two of N Code that identifies an actuated switch.

More specifically, each capacitive switch is coupled to a unique pair of the conductors such that the capacitance associated with the unique pair of conductors indicates whether the capacitive switch has been actuated by the finger of a user. The capacitance detector compares the capacitance associated with each interrogated conductor with a reference capacitor and provides an output which is stored in the storage means that indicates whether the capacitance associated with each interrogated conductor is greater or less than the reference capacitor.

BRIEF DESCRIPTION OF THE DRAWINGS

The present invention will be clearly understood from the detailed description which follows taken in conjunction with the appended drawings wherein like reference characters designate like or corresponding parts throughout the several views and wherein.

DESCRIPTION OF PREFERRED EMBODIMENTS

Figure 1:
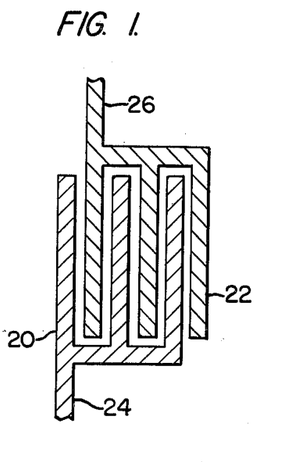
FIGS. 1 and 2 illustrate typical capacitive switches which may be utilized with the present invention.
Figure 2:
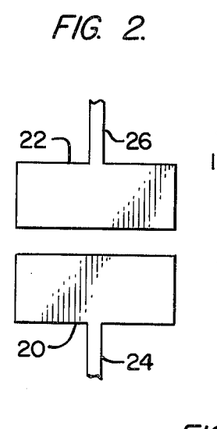

Capacitive switches which are generally actuated by the finger touch of an operator can be fabricated by forming a pair of conductive touch surfaces or plates on a suitable insulating surface, such as imperforate ceramic or glass, in accordance with well known thin film or thick film techniques. FIGS. 1 and 2 illustrate typical conductive touch surfaces of capacitive switches. FIG. 2 illustrates rectangular isolated, conductive plates 20 and 22 each having a connecting lead 24 and 26, respectively, connected thereto. The capacitive switch is actuated by a user's finger bridging the gap between the two conductive plates 20 and 22. The object is to couple as much capacitance from a person's finger into the circuit as possible. This requires that the area of the two plates 20 and 22 should be at least as large as the contact area of a person's finger. A variation of the split plate capacitive switch illustrated in FIG. 2 is illustrate in FIG. 1 wherein the two plates 20 and 22 are interdigitated.

Because the gap between the plates 20 and 22 is sinuous, the contact area of the user's finger is less stringent than with the split plate configuration of FIG. 2. As will now be apparent, the pair of isolated, conductive plates 20 and 22 can have various symmetrical or unsymmetrical geometric shapes, or outlines.

Figure 3:
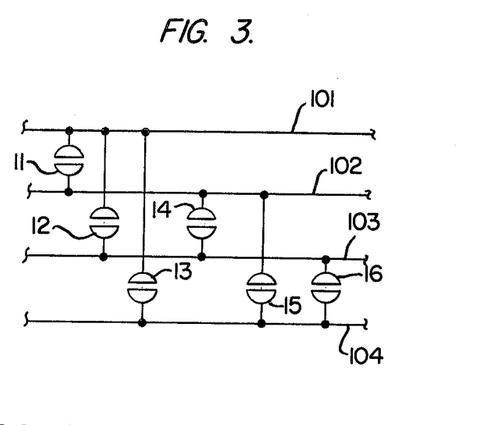
FIG. 3 illustrates a plurality of capacitive switches interconnected with a plurality of conductors in accordance with a preferred embodiment of the present invention.

Illustrated in FIG. 3 are four electrical conductors 101, 102, 103 and 104. Connected between a unique pair of the conductors 101-104 are six capacitive switches 11, 12, 13, 14, 15 and 16. Each conductive isolated plate portion of the capacitive switches is illustrated, by way of example, as comprising semi-circular plates. Each unique pair of the four conductors 101-104 identifies one of the six capacitive switches 11-16 even though each contuctor 101-104 is connected to more than one of the six switches 11-16. For example the pair of conductors 101 and 102 are associated only with switch 11, conductors 101 and 103 with switch 12, conductors 101 and 104 with switch 13; conductors 102 and 103 with switch 14; conductors 102 and 104 with switch 15; and conductors 103 and 104 with switch 16. A switch 11-16 which is actuated by the touch of a user will increase the capacitance to ground of the pair of conductors associated with the actuated switch. For example, actuation of switch 14 will cause the capacitance to ground of conductors 102 and 103 to be greater than the remaining conductors 101 and 104. Likewise actuation of switch 16 causes the capacitance to ground of conductors 103 and 104 to be greater than that of the remaining conductors 101 and 102.

Figure 4:
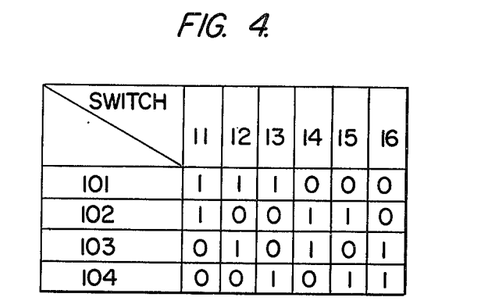
FIG. 4 illustrates a truth table for the switches and conductors illustrated in FIG. 3.

If the presence of a larger amount of capacitance is considered to be a logic 1 and the presence of a lesser amount of capacitance is considered to be a logic zero, the truth table of FIG. 4 sets forth the logic levels found on the conductors or lines, 101-104 for an actuation of any one of the switches 11-16. As shown by a perusal of FIG. 4, actuation of one of the switches 11-16 will always cause only the pair of conductors associated with the actuated switch 11-16 to be at a logic one level while the remaining conductors are at a logic zero level. As will now be apparent, the capacitance on the conductors 101-104 whenever one of the switches 11-16 is actuated constitutes a two of N Code that identifies the actuated switch, with N being the number of conductors 101-104 in the matrix 28. For example actuation of the switch 12 sets up the binary signal of 1010 on conductors 101, 102, 103 and 104, respectively, while actuation of the switch 11 sets up the binary signal of 1100 on conductors 101, 102, 103 and 104, respectively.

As the number of conductors N is increased, the number of unique conductor pairs that identify a particular capacitive switch increases according to the formula:

$$K=(N-1)+(N-2)+(N-3)+\cdots(N-[N-1])$$

where K is the number of unique pairs of conductors or capacitive switches, and N is the number of conductors. Accordingly, and in accordance with the interconnections illustrated in FIG. 3, the use of five conductors enables the use of ten capacitive switches, six conductors fifteen switches, seven conductors twenty one switches, eight conductors twenty eight switches and so on. Regardless of the number of conductors 101-104 used, the logic levels present on the conductors 101-104 will constitute a two of N Code that identifies the actuated switch since an actuated switch will increase the capacitance of only the unqiue pair of conductors associated therewith. The simultaneous actuation of two or more switches will cause more than two conductors to have an increased capacitance. For example, the simultaneous actuation of switches 14 and 16 in FIG. 3 will cause conductors 102, 103 and 104 to be at a logic one level (FIG. 4) due to the added capacitance associated therewith. As will be apparent to those skilled in the art, this condition can readily be detected to produce an error indication or to ignore the condition until only two conductors have added capacitance, or a logic one level, associated therewith.

Figure 5:
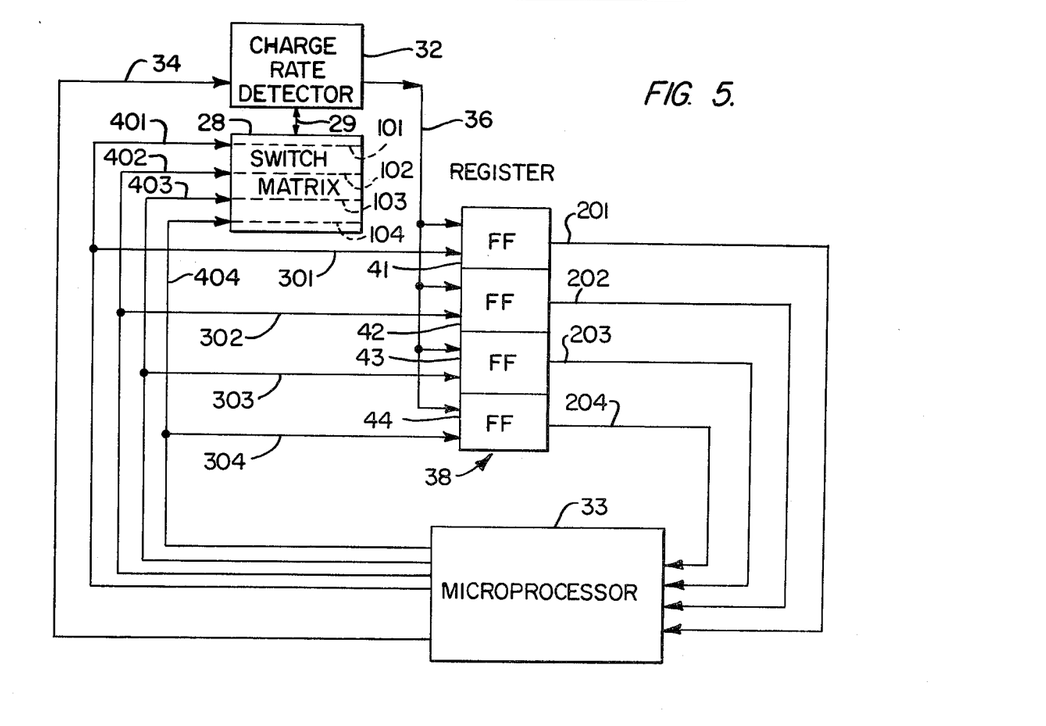
FIG. 5 is a block diagram illustration of a capacitive, charge rate, multiplexed switch system in accordance with the present invention.

A charge rate, capacitive switch system in accordance with the present invention is illustrated in FIG. 5 as including a matrix 28 of capacitive switches. For purposes of describing the present invention the switch matrix 28 will be considered to be that illustrated in FIG. 3. It should be understood, however, that a switch matrix 28 including substantially more capacitive switches 11-16 and conductors 101-104 than that illustrated in FIG. 3 can be utilized in the type of system illustrated in FIG. 5. For purposes of clarity and simplicity in the drawings, the capacitive switches 11-16 are not illustrated within the switch matrix 28. The conductors 101, 102, 103 and 104, however, are shown within the switch matrix 28 by dotted lines.

Coupled to the capacitive switch matrix 28, by way of a lead 29, is a single, charge rate detector 32 that includes a reference capacitor (not shown FIG. 5) that is selected to have a capacitance that is less than that associated with the conductors 101-104 whenever a capacitive switch 11-16 associated therewith is actuated but that is greater than the capacitance associated with the conductors 101-104 whenever none of the capacitive switches 11-16 associated therewith are actuated. Briefly described, the charge rate detector 32 will produce a logic one on the output lead 36 if the capacitance associated with a conductor 101, 102, 103 or 104 is greater than the reference capacitor of the charge rate detector 32 and will produce a logic zero on the output lead 36 if the capacitance associated with a 101, 102, 103, or 104 is less than the reference capacitor. The operation of the charge rate detector is described in detail herebelow in conjunction with FIG. 8.

A microprocessor 33 provides a continuous series of actuating signals to the charge rate detector 32 by way of a lead 34. The conductors 101-104 of the switch matrix 28 are coupled to the microprocessor 33 by way of leads 401, 402, 403 and 404, respectively, and sequentially receive interrogating or actuating signals provided by the microprocessor 33 that enable the charge rate detector 32 to compare the capacitances associated with the individual conductors 101-104 with the reference capacitor (not shown FIG. 5).

A storage register 38 includes a storage element 41, 42, 43 and 44 for each of the conductors 101-104, respectively, in the switch matrix 28. Each storage element 41-44 includes a suitable binary storage device, such as a gated D flip-flop. The enabling input of each storage element 41-44 is coupled to its associated switch matrix 28 conductor 101-104 by leads 301, 302, 303 and 304, respectively. Associated with each storage element 41-44 is an output lead 201, 202, 203, and 204, respectively, which is coupled to the microprocessor 33. The input of each storage element 41-44 is coupled to the output of the charge rate detector 32 by being connected to the lead 36. As each conductor 101-104 is interrogated, each storage element 41-43 will store a logic one if its associated matrix switch 28 conductor 101–104 has a capacitance greater than the reference capacitor (not shown FIG. 5) of the charge rate detector 32 and will store a logic zero if its associated matrix switch 28 conductor 101–104 has a capacitance less than the reference capacitor of the charge rate detector 32. The capacitance associated with any one of the capacitive switch matrix 28 conductors 101–104 will be greater than the reference capacitor of the charge rate detector 32 whenever a capacitive switch 11–16 associated therewith has been actuated by the finger of a user and will be less than the reference capacitor of the charge rate detector 32 whenever none of the capacitive switches 11–16 associated therewith are actuated.

Figure 6:
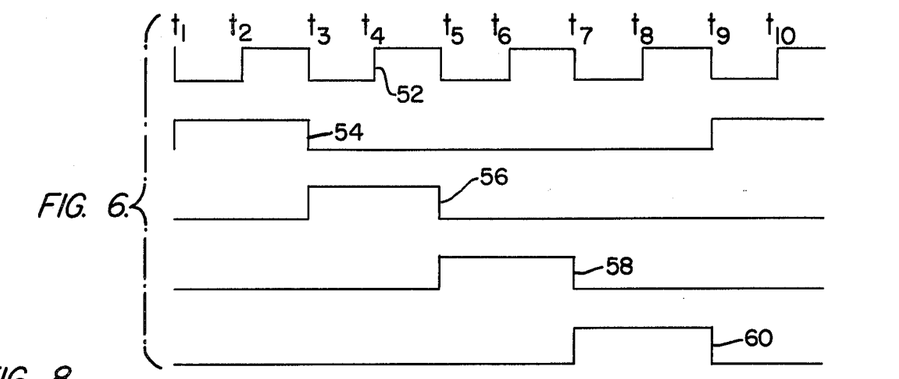
FIG. 6 illustrates various idealized signal waveforms that are utilized in the system illustrated in FIG. 5.

Referring now to FIG. 6, waveform 52 illustrates a cyclical square wave that is applied to the charge rate detector 32 from the microprocessor 33 by way of the lead 34. Waveforms 54, 56, 58 and 60 illustrate positive pulses that are sequentially applied to capacitive switch matrix conductors 101–104 by way of the leads 401–404 respectively. As shown in FIG. 6, each of the positive pulses 54, 56, 58 and 60 has a time duration equal to one complete cycle of the square wave 52 input to the charge rate detector 32.

The operation of the system illustrated in FIG. 5 will become apparent by assuming that capacitive switch 15 (FIG. 3) is actuated by a person's finger bridging the gap between the isolated plates. As shown by FIG. 4, this results in the capacitance of matrix switch 28 conductors 102 and 104 being greater than the capacitance associated with conductors 101 and 103, i.e. the binary signal 0101. The capacitance of the reference capacitor (not shown FIG. 5) of the charge rate detector 32 will be greater than the capacitance associated with the conductors 101 and 103 but less than the capacitance associated with the conductors 102 and 104. During the time interval t1 to t3 (FIG. 6) the input 56, 58 and 60 to conductors 102, 103, and 104 by way of leads 402, 403 and 404 is low or negative, and these conductors are caused to be clamped to a reference potential, such as ground, as is described hereinbelow in detail in conjunction with FIG. 8. This negative potential is also applied to storage elements 42, 43 and 44 by way of leads 302, 303 and 304 to disable them during this time period. The switch matrix conductor 101, however, has a positive potential 54 applied thereto by lead 401 and, in a manner as described hereinbelow in detail, is coupled to the charge rate detector 32. This positive potential 54 is also applied to the storage element 41, by way of lead 301, to enable it. During the time interval t1 and t2, a negative potential is applied to the reference capacitor (not shown FIG. 5) and to the capacitance associated with the interrogated switch matrix 28 conductor 101. By the time t2, both of these capacitances have had ample time to charge up to the value of this negative potential. During the time interval t2 and t3, the waveform 52 is positive and the reference capacitor (not shown FIG. 5) of the charge rate detector 32 and the capacitance associated with the conductor 101 will discharge in a manner as described hereinbelow in detail in conjunction with FIG. 8. Since the reference capacitor (not shown FIG. 5) is larger than the capacitance associated with the conductor 101 when the capacitive switch 15 is actuated, the reference capacitor (not shown FIG. 5) will discharge slower than the capacitance associated with the conductor 101 and the charge rate detector 32 will latch into a logic zero state which results in a logic zero level being set into the storage element 41 at time t3. During the time interval t3 to t5, the conductors 101, 103 and 104 will be clamped to a reference potential and storage elements 41, 43 and 44 will be disabled while the conductor 102 and the storage element 42 are enabled by the positive pulse 56. In a manner as described above, the reference capacitor (not shown FIG. 5) and the capacitance associated with the interrogated conductor 102 are charged to a negative potential during the time interval t3 and t4 and allowed to discharge during the time interval t4 to t5. Since the actuated capacitive switch 15 increases the capacitance of line 102, this capacitance will discharge slower than the reference capacitor (not shown FIG. 5) of the charge rate detector 32 thereby latching the charge rate detector 32 to a logic one level which results in a logic one being set in the storage element 42 at time t5.

In a like manner the switch matrix 28 conductors 101, 102 and 104 are clamped during the time interval t5 to t7 and the storage elements 41, 42, and 44 are disabled while the conductor 103 and the storage element 43 are enabled. Due to the larger capacitance of the charge rate detector 32 reference capacitance (not shown FIG. 5) the charge rate detector 32 will be latched into a logic zero state and a logic zero will be set into the storage element 43 at time t7. Conversely, during the time interval t7 to t9 the conductors 101, 102, and 103 are clamped and the storage elements 41, 42 and 43 are disabled while the conductor 104 and the storage element 44 are enabled. Due to the conductor 104 having the larger capacitance, the charge rate detector 32 is latched into a logic one level and a logic one is set into the storage element 44 at time t9.

As is now apparent, at the end of one complete cycle the storage elements 41–44 contain the binary number 0101 which, as shown by the truth table of FIG. 4, is a two of N Code that identifies the actuated switch of FIG. 3 as being the switch 15. The cycle will be repeated continuously with the binary number appearing in the storage register 38 changing in accordance with the truth table of FIG. 4 as different capacitance switches 11–16 are actuated. The outputs of the storage elements 41–44 of the storage register 38 appear on the leads 201–204, coupled to the microprocessor 33. The microprocessor 33 can be programmed, in accordance with any number of well known techniques, to recognize a valid switch 11–16 actuation as one that exists, unchanged, for at least a minimum period of time. For example, the microprocessor 33 will recognize a switch 11–16 as being actuated only if the binary number corresponding to the switch 11–16 exists, unchanged in the storage register 38 for at least the selected minimum time interval. In this way, noise and spurious switch 11–16 actuations are ignored. Also, as described above, the simultaneous actuation of two or more of the capacitive switches 11–16 will cause three or more of the conductors 101–104 to have increased capacitance associated therewith thereby causing at least three logic one levels to be stored in the storage register 38. The presence of more than two logic one levels (regardless of the number of conductors and switches utilized in the switch matrix 28) is readily recognized by the microprocessor 33 as an invalid condition. Accordingly, a valid switch 11–16 actuation is detected as the existence of a binary number in the storage register 38 that contains only two logic one levels and which occurs in the storage register 38, unchanged, for at least a predetermined minimum amount of time. Any other conditions are treated by the microprocessor 33 as invalid or erroneous. As will be apparent to those skilled in the art the register 38 may, alternatively, comprise a shift register wherein data entered therein from the lead 36 may be outputed therefrom in serial form in a single output lead (not shown).

Figure 8:
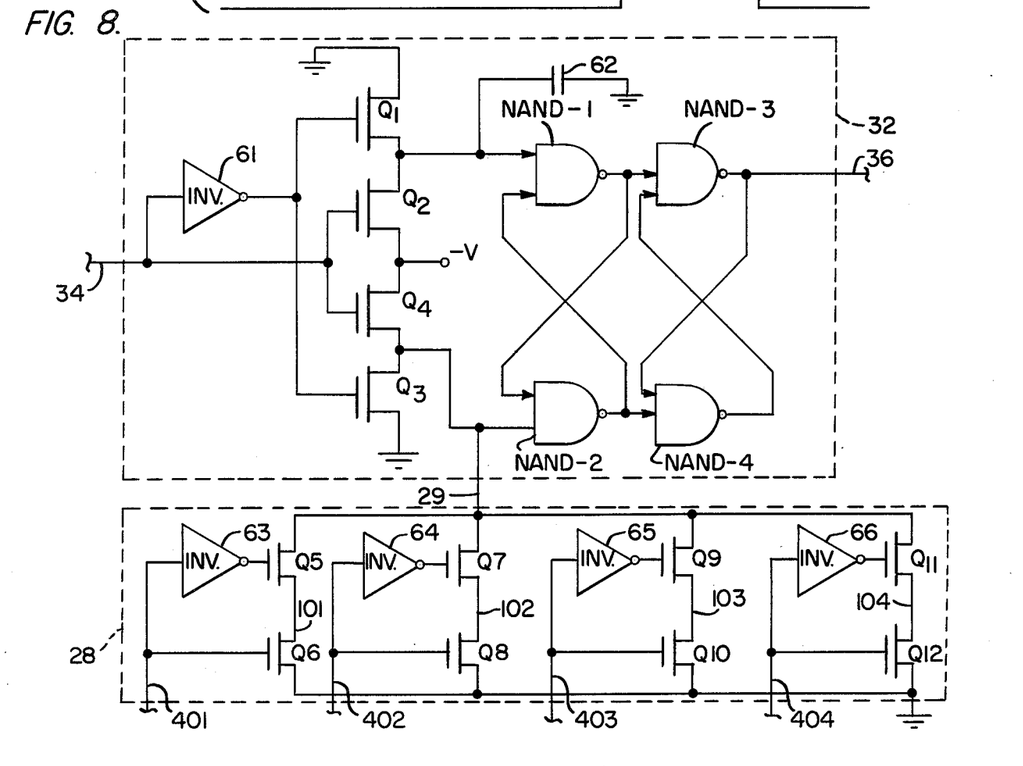
FIG. 8 illustrates in detail a charge rate detector and conductor switching logic that can be utilized in the system illustrated in FIGS. 5 and 7.

A specific charge rate detector circuit 32 together with switching means enabling coupling to selected ones of the conductors 101-104 in the switch matrix 28 is illustrated in FIG. 8 wherein the charge rate detector circuit is illustrated within the dotted outline 32. The charge rate detector 32 is coupled to one end of the conductors 101-104 of the switch matrix 28 by way of the lead 29 and MOS transistors Q5, Q7, Q9 and Q11, respectively, while the other end of the conductors 101-104 are coupled to a reference potential, such as ground, by MOS transistors Q6, Q8, Q10 and Q12, respectively. For purposes of simplicity and clarity the interconnection of the capacitive switches 11-16 with the switch matrix 28 conductors 101-104 as illustrated in FIG. 3 is not shown in FIG. 8, as was the case with FIG. 5. As shown, the enabling signal 54 carrying lead 401 for the switch matrix 28 conductor 101 is directly connected to the gate of transistor Q6 and is coupled to the gate of transistor Q5 by way of an inverter 63. In a like manner the lead 402 associated with the conductor 102 is directly connected to the gate of transistors Q8 and is coupled to the gate of transistor Q7 by way of an inverter 64, the lead 403 associated with the conductor 103 is directly connected to the gate of transistor Q10 and is coupled to the gate of transistor Q9 by way of an inverter 65 and the lead 404 associated with the conductor 104 is directly connected to the gate of transistor Q12 and is coupled to the gate of transistor Q11 by way of an inverter 66. The coupling of a selected one of the switch matrix 28 conductors 101-104 to the charge rate detector circuit 32 by way of the lead 29 will readily be understood by assuming the time interval t3 to t5 (FIG. 6) during which time the positive pulse 56 appears on the lead 402 and the remaining leads 401, 403 and 404 are at a negative, or low, potential. The positive, or high, potential on lead 402 renders the transistor Q8 nonconductive thereby preventing the switch matrix 28 conductor 102, from being electrically connected to ground potential by way of transistor Q8. The positive potential on lead 402 also appears on the gate of the transistor Q7 as a negative potential due to the inverter 64 and renders the transistor Q7 conductive thereby electrically connecting the switch matrix 28 conductor 102 to the charge rate detector 32 by way of the lead 29. At the same time, the negative potential on the leads 401, 403 and 404 renders the transistors Q6, Q10 and Q12 conductive thereby electrically connecting the switch matrix 28 conductors 101, 103 and 104 to ground. Since the gates of transistors Q5, Q9 and Q11 are positive due to the inverters 63, 65 and 66, respectively, the transistors Q5, Q9 and Q11 are nonconductive. Therefore, the switch matrix 28 conductors 101, 103 and 104 are not electrically connected to the charge rate detector 32 during this time interval t3 to t5. In a like manner, the remaining switch matrix 28 conductors 101, 103 and 104 are sequentially coupled to the charge rate detector 32 as the positive pulses 54, 58 and 60 appear on the leads 401, 403 and 404, respectively.

The charge rate detector 32 circuit includes four interconnected MOS transistors Q1, Q2, Q3 and Q4. Transistors Q1 and Q2 form a push-pull circuit as does transistors Q3 and Q4. The square wave signal 52 (FIG. 6) appearing on the input lead 34 and its inversion, due to inverter 61, controls the switching of transistors Q2, Q4 and Q1, Q3, respectively. Transistors Q1 and Q3 are matched for transconductance, as are transistors Q2 and Q4. The square wave signal 52 on the input lead 34 is directly connected to the gates of transistors Q2 and Q4 and are coupled to the gates of transistors Q1 and Q3 by way of an inverter 61. The sources of transistors Q1 and Q3 are connected to ground the drains of transistors Q2 and Q4 are connected to a source of negative potential-V. The drain of transistor Q1 and the source of transistor Q2 are connected to one side of a reference capacitor 62 (the other side of which is grounded) and also to one input of a gate NAND-1. The drain of transistor Q3 and source of transistor Q4 are connected to the enabled, or interrogated, one of the switch matrix 28 conductors 101-104 by way of the lead 29 and also to one input of a gate NAND-2. The output of gate NAND-1 is connected to the second input of gate NAND-2 and the output of gate NAND-2 is connected to the second input of gate NAND-1 to form a latch circuit. The output of gate NAND-1 also connects to one input of a gate NAND-3 and the outut of gate NAND-2 connects to one input of a gate NAND-4. The output of gate NAND-3 connects to the other input of gate NAND-4 and the output of gate NAND-4 connects to the other input of NAND-3 to form another latch circuit which is used as a temporary memory and provides the output signal for the charge rate detector 32 circuit on the output lead 36.

The logic zero condition of the charge rate detector 32 corresponds to the reference capacitor 62 being greater than the capacitance to ground of the switch matrix 28 conductor 101-104 that is coupled to the charge rate detector 28 by way of the lead 29. The square wave signal 52 (FIG. 6) is continuous and when it becomes negative, or low, transistors Q2 and Q4 are rendered conducting thereby simultaneously charging the reference capacitor 62 and the capacitance to ground of the conductor 101-104 that is then coupled to the lead 29 to the negative potential-V. The actual voltage charge is dependent upon the voltage level of the square wave signal 52, the threshold voltage of transistors Q2 and Q4, and the negative potential-V. At the same time the inverter 61 output is positive, or high, and holds transistors Q1 and Q3 nonconducting. The resulting negative potentials on lead 29 and at the reference capacitor 62 keeps the output of gates NAND-2 and NAND-1, respectively, at a positive, or high, potential. The output of the latch on lead 36 will remain at whatever state it was at previously. When the square wave signal 52 goes positive, or high, the transistors Q2 and Q4 become nonconductive and the negative output of the inverter 61 renders transistors Q1 and Q3 conductive. The potential at the reference capacitor 62 and on the lead 29 then rises at a rate determined by the magnitude of the capacitance of the reference capacitor 62 and the capacitance to ground of the conductor 101-104 that is coupled to the lead 29, respectively. The discharge rate is also affected by the transconductance of transistors Q1 and Q3. When the reference capacitor 62 is larger than the capacitance to ground of the enabled conductor 101-104 that is coupled to the lead 29, the enabled conductor 101-104 capacitance will discharge faster than the reference capacitor 62 thereby causing the potential at the input of gate NAND-2 appearing on the lead 29 to reach the threshold level of gate NAND-2 before the potential at the reference capacitor 62 reaches the threshold potential of gate NAND-1. The inputs of gate NAND-2 are then both at a positive, or high, level and its output switches to a negative, or low, potential thereby latching the output of gate NAND-1 at a positive, or high, potential. The output of gate NAND-2 being negative, or low, and the output of gate NAND-1 being positive, or high, renders, the output of gate NAND-3 low and the output of gate NAND-4 high. This sets the memory latch output on lead 36 to a low, or logic zero, level which is entered into the storage register 38 in a manner as described above. The charge rate detector 32 circuit is disclosed in U.S. Pat. No. 4,055,129 and assigned to the assignee of the present invention.

In the case where additional capacitance is introduced into the switch matrix 28 conductor 101-104 that is enabled and coupled to lead 29, by reason of a capacitive switch 11-16 coupled thereby being actuated by the touch of a person's finger, the capacitance of reference capacitor 62 will be less than the capacitance to ground of the conductor 101-104 coupled to the lead 29. Accordingly, when the square wave pulse 52 goes positive after these capacitances have charged toward the negative potential-V, transistors Q1 and Q3 will be turned on and the potential at the reference capacitor 62 reaches the threshold of gate NAND-1 before the potential on the lead 29 reaches the threshold of gate NAND-2. The output of gate NAND-1 goes low causing gate NAND-2 to latch with its output in a high state thereby rendering the output of gate NAND-4 low and the output of gate NAND-3 high. This sets the memory latch output on the output lead 36 to a high, or logic one, level which is entered into the storage register 38 in a manner as described above.

As is apparent from the description above, the circuits described in conjunction with FIG. 8 are P-channel MOS devices that are readily fabricated by integrated circuit techniques and are active low. The frequency of the square wave 52 (FIG. 6) is determined by the time needed to charge and discharge the capacitances that are compared by the charge rate detection circuit 28 which in turn is determined by the parameters of the circuits illustrated in FIG. 8. In one embodiment of the present invention which was constructed, the square wave 52 had a frequency of twenty five thousand hertz.

Figure 9:
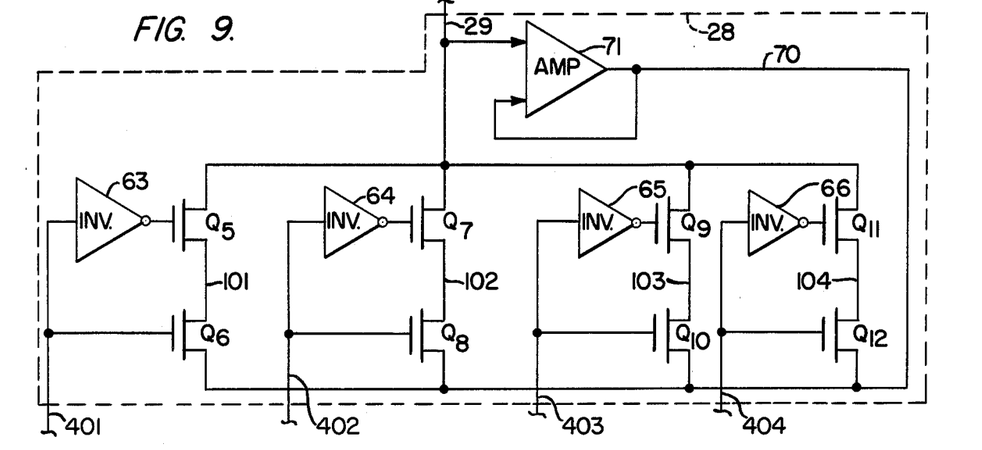
FIG. 9 illustrates a modification of the circuits illustrated in FIG. 8.

FIG. 9 illustrates a modification of the switching logic associated with the switch matrix 28 conductors 101-104. Rather than connecting the unselected conductors of the switch matrix 28 to ground during the time interval that the interrogated conductor is coupled to the charge rate detector 32 as in the embodiment of FIG. 8, the unselected conductors in FIG. 9 are driven by the currents appearing on the lead 29 by means of a unity gain amplifier 71, and a connecting lead 70. This enables the charging and discharging currents applied to the interrogated switch matrix 28 conductor 101-104 to also drive the unselected switch matrix 28 conductors thereby simultaneously isolating all additional shunt and parasitic capacitances associated with the switch matrix 28 conductors 101-104. This causes all of the charging current detectable in the interrogated switch matrix 28 conductor 101-104 to be wholly attributable to the unknown capacitance associated with the interrogated conductor. The operation of the embodiment illustrated in FIG. 9 will become apparent by assuming the time interval t3 to t5 (FIG. 6) during which time the positive pulse 56 appears on the lead 402 thereby rendering the transistor Q8 nonconductive and the transistor Q7 conductive to couple the switch matrix 28 conductor 102 to the charge rate detector 32 by way of the lead 29. During this time interval the remaining leads 401, 403, and 303 are at a negative potential which renders transistors Q6, Q10, and Q12 conductive and transistors Q5, Q9 and Q11 nonconductive to couple the switch matrix conductors 101, 103 and 104 to the output of the unity gain amplifier 71 which has its input coupled to the lead 29. Interrogated ones of the other conductors 101, 103, and 104 and unselected ones of the conductors 101-104 are connected to the lead 29 and the output of the unity gain amplifier, respectively, in a like manner under control of the positive pulses 54, 56, 58 and 60 (FIG. 6).

Figure 11:
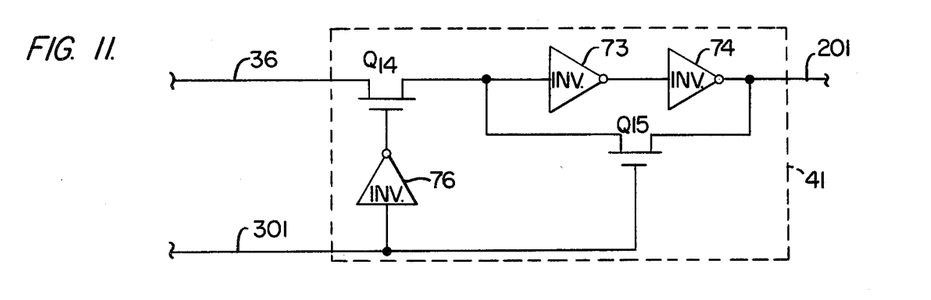
FIG. 11 illustrates in detail a gated D flip flop which may be utilized in the system of FIGS. 5 and 7.

A P channel MOS gated D flip-flop that may be utilized in the storage register 38 of the system illustrated in FIG. 5 is shown in FIG. 11 within the dotted outline 41, which corresponds to the storage element 41 in the storage register 38 of FIG. 5. The flip-flop 41 includes two serially connected inverters 73 and 74 having feedback controlled by a MOS transistor Q15. Another MOS transistor Q14 is coupled between the output of the charge rate detector 32 appearing on the output lead 36 and the two serially connected inverters 73 and 74. The output of the gated D flip flop 41 appears on the output lead 201 and corresponds to the output of the inverter 74. The enabling lead 301 which, as described above, corresponds to the conductor 101 in the switch matrix 28 is directly connected to the gate of transistor Q15 and is coupled to the gate of transistor Q14 by way of an inverter 76. The operation of the gated D flip-flop will become apparent by assuming the time interval t1 to t3 (FIG. 6) during which the positive pulse 54 appears on the enabling lead 301. This positive potential 54 renders the transistor Q15 nonconductive and when converted to a negative potential by the inverter 76 renders the transistor Q14 conductive. With the transistor Q14 conducting and the transistor Q15 nonconducting the output level on the output lead 201 is the same as the input level on the input lead 36 which is the output of the charge rate detector 28. During the other time intervals the enabling lead 301 is negative, as was discussed above, which renders the transistor Q14 nonconducting and the transistor Q15 conductive. For this condition, the output lead 201 is no longer coupled to the input lead 36. Due to the feedback through the transistor Q15, however, the level on the output lead 201 remains at the same level that it was when Q14 went from a conducting state to a nonconducting state. As is clear from the description above in conjunction with FIG. 5, this level corresponds to the logic state (zero or one) indicative of the amount of capacitance on the conductor 101. Similar flip-flops in the storage register 38 and associated with the remaining switch matrix conductors 102, 103 and 104 would operate in a similar manner.

Figure 7:
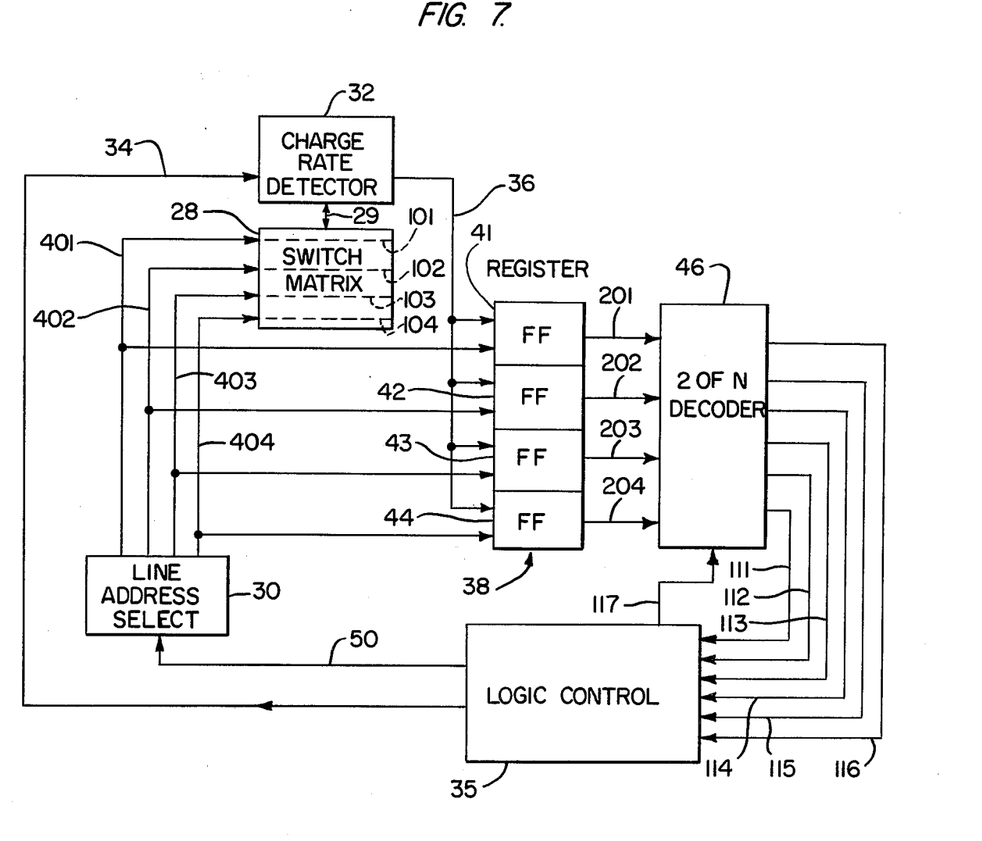
FIG. 7 illustrates a modification of the system illustrated in FIG. 5.

The system illustrated in FIG. 5 may be readily modified to actuate, or enable, a separate and distinct output lead for each of the actuated capacitive switches 11-16. This may be desirable when only a few capacitive switches are used in the system or when the number of leads connected to other circuitry in the system is unimportant. As shown in FIG. 7, such a system includes a two of N decoder 46 coupled to the output leads 201-204 of the storage register 38. The decoder 46 has an output lead 111, 112, 113, 114, 115, and 116 associated with each capacitive switch 11, 12, 13, 14, 15 and 16, respectively, in the switch matrix 28. The operation of the decoder 46 is such that when the switch 11 is actuated output lead 111 is enabled (contains a logic one level thereon), when switch 12 is actuated lead 112 is enabled, when switch 13 is actuated lead 113 is enabled, and so on. The output of the decoder 46 is coupled to logic control circuits 35 that utilize the switch actuation data on leads 111-116 in any desired, predetermined manner. The logic circuitry 35, by way of an enabling signal carrying lead 117 coupled to the decoder 46, will enable, or read out, the decoder 46 only after a complete cycle of interrogation of the switch matrix 28 conductors 101-104. As will be apparent to those skilled in the art, the logic circuitry 35 may also be used to supply the square wave signal 52 (FIG. 6) to the charge rate detector 32 by way of the lead 34. A suitable square wave signal 52 generator, for example, could include an oscillator controlled multivibrator (not shown). The signal 52 can also be utilized to generate the interrogating signals 54, 56, 58 and 60 (FIG. 6). This can be accomplished by applying the square wave signal 52, by way of a lead 50, to a line address selector circuit 30. The selector circuit 30 will produce four sequentially occurring pulses 54, 56, 58 and 60 on the leads 401, 402, 403 and 404, respectively, in response to every four complete cycles of the signal 52. A four stage ring counter (not shown) could, for example, provide the desired function for the selector circuit 30.

Figure 10:
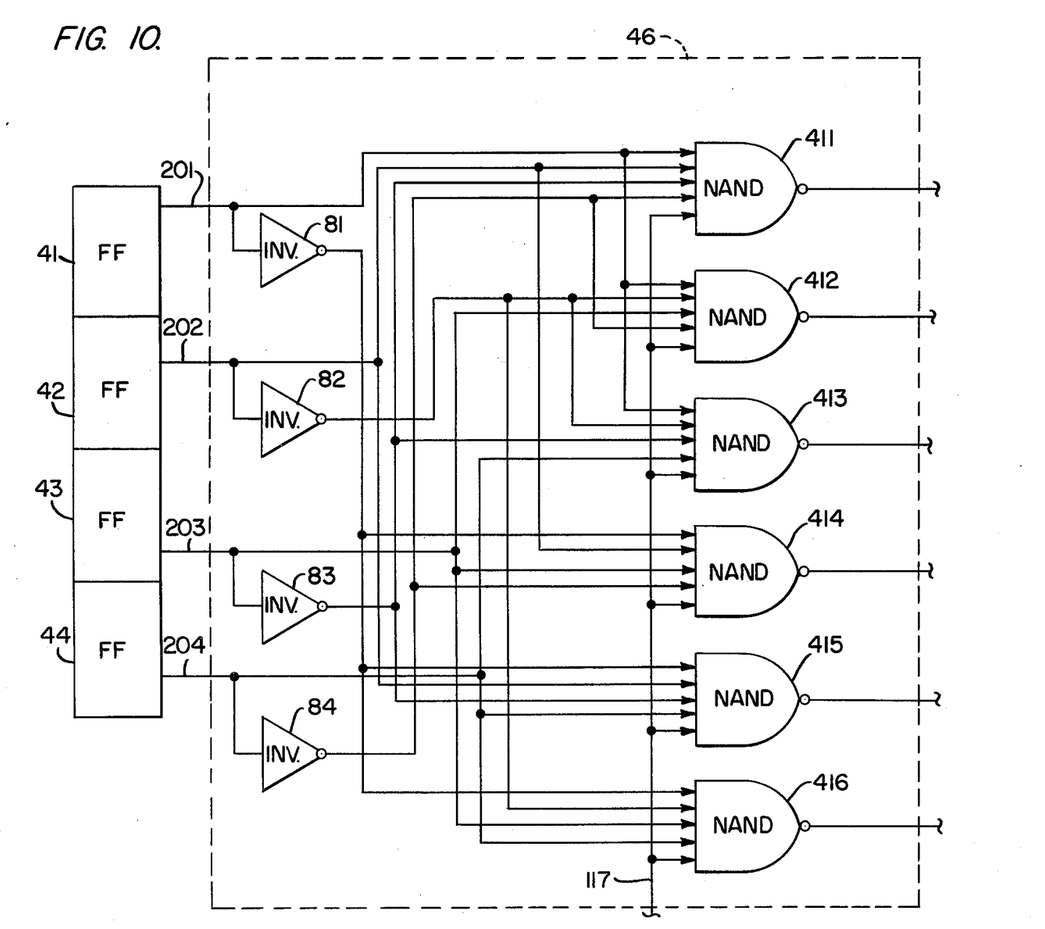
FIG. 10 illustrates a two of N decoder that may be utilized with the system illustrated in FIG. 7.

FIG. 10 illustrates in detail a circuit that may be utilized as the two of N decoder 46 in the system illustrated in FIG. 7. The circuit shown within the dotted outline 46 includes a NAND gate 411, 412, 413, 414, 415 and 416 for each of the capacitive switches 11, 12, 13, 14, 15 and 16, respectively. Each NAND gate 411-416 is coupled to receive the enabling signal from the logic circuitry 35 appearing on the lead 117 and is also coupled to receive the inverted or non-inverted output of each stage 41-44 of the storage register 38. The operation of the decoder 46 is such that the presence of a two of N Code in the register 38 will enable only the NAND gate 411-416 associated with the actuated capacitive switch 11-16 identified by the two of N Code. To be enabled, all of the inputs to a NAND gate 411-416 must be high. However, since the binary number representating an actuated switch 11-16 contains only two logic one levels, some of the inputs to each of the NAND gates 411-416 must be inverted. This is accomplished by inverters 81, 82, 83 and 84 which have their inputs coupled to the outputs of the storage elements 41, 42, 43 and 44, respectively and have their outputs coupled to selected ones of the NAND gates 411-416 as shown in FIG. 10.

The operation of the encoder 46 shown in FIG. 10 will become apparent from consideration of actuation of the capacitive switch 16 (FIG. 3) which results in the binary number 0011 (FIG. 4) being set into the storage elements 41-44, respectively, of the storage register 38. To enable NAND gate 416 associated with the capacitive switch 16, all of its inputs must be high. Accordingly, NAND gate 16 has an inputs thereto the inverted outputs of the storage elements 41 and 42, by means of the inverters 81 and 82, and the true outputs of the storage elements 43 and 44. With the capacitive switch 16 actuated, the NAND gate 16 will be enabled upon occurrence of an enabling signal on the lead 117. In a like manner, NAND gate 415 associated with the capacitive switch 15 and having the binary number 0101 (FIG. 4) is coupled to the inverted outputs of the storage elements 41 and 43 and to the true outputs of the storage elements 42 and 44. The remaining NAND gates 414, 413, 412 and 411 are similarly coupled to selected ones of the inverted and true outputs of the storage elements 41-44 so as to be enabled only upon the actuation of their associated capacitive switch 14, 13, 12 and 11, respectively.

As will be apparent to those skilled in the art, the use of the conductor 101-104 switch 11-16 arrangement that enables a lesser number of conductors 101-104 to be utilized for a given number of switches 11-16 is not essential to the practice of this invention since an X-Y matrix that requies more conductor 101-104 for a given number of switches 11-16 may be utilized with the single charge rate detector 32 described above.

As with the system illustrated in FIG. 5, the control logic 35 in the system of FIG. 7 can readily be designed to only recognize as a valid switch 11-16 actuation one that exists, unchanged, for at least a predetermined length of time or a number of line interrogation cycles. Additionally, actuation of two, or more, switches 11-16 simultaneously, will enable two, or more, NAND gates 411-416. The control logic 35 can readily distinguish such outputs and either ignore them or produce an error signal.

As is apparent from the description above in conjunction with FIGS. 1-11, the capacitive charge rate system of the present invention can readily be fabricated from integrated circuits and thick and/or thin films to provide an economical and reliable system. Additionally, since a relatively large number of capacitive switches can be identified by a lesser number of leads, the system can readily be coupled to large scale integrated circuits having only a limited number of external connections.

While the present invention has been particularly shown and described with reference to preferred embodiments thereof, it will be understood by those skilled in the art that various changes in form and detail may be made without departing from the spirit and scope of the present invention as defined by the appended claims.

What is claimed is:

1. A capacitive switch system comprising:
   a plurality of conductor means;
   a plurality of capacitive switches;
   each said capacitive switch coupled between a unique pair of said conductor means;
   means for sequentially interrogating each said conductor means;
   a reference capacitance; and
   a capacitor detector for simultaneously comparing the capacitance associated with a said interrogated conductor means with said reference capacitance;
   said sequential interrogating means including switching means coupled to said conductor means and said detector for coupling each said interrogated conductor means to said detecting means for simultaneously charging and discharging said reference capacitance and the capacitance associated with an interrogated said conductor means.

2. The capacitive switch system according to claim 1 further including
   storage means coupled to said capacitance detector for storing an indication of whether the capacitance associated with each said conductor means is greater or less than said reference capacitance.

3. The capacitive switch system according to claim 1 wherein
   said detector includes a latch that is set into one state whenever said reference capacitance is larger than the capacitance associated with an interrogated said conductor means and is set into another state whenever said reference capacitance is smaller than the capacitance associated with an interrogated said conductors means.

4. The system according to claim 1 wherein said switching means includes means to sequentially couple each of said conductor means to said detector in synchronism with said sequential interrogation of said conductor means and to couple the remaining said conductor means not then coupled to said detector to a reference potential.

5. The system according to claim 1 further including:
an amplifier having an input and an output;
said interrogating means including means to sequentially couple each of said conductor means to said detector in synchronism with said sequential interrogation of said conductor means and
means for coupling the input of said amplifier to said interrogated conductor means and the output of said amplifier to those said conductor means not then coupled to said detector.

6. The system according to claim 1 wherein:
said detector means includes means for simultaneously comparing the charge rate of said reference capacitance with the charge rate of the capacitance associated with the interrogated conductor means.

7. The system according to claim 2 wherein
said storage means includes a bistable storage element associated with each said conductor means,
each said bistable element being in one state when the capacitance associated with its conductor means is greater than said reference capacitance and being in the other state when the capacitance associated with its conductor means is less than said reference capacitance.

8. The system according to claim 2 wherein
the indications in said storage means constitute a 2 of N code that identifies a selected one of said capacitive switches.

9. The system according to claim 2 further including an output lead associated with each of said capacitive switches; and
decode means coupled between said storage means and said output leads to actuate one of said output leads in accordance with the capacitance indications in said storage means.

10. A capacitive switch system comprising:
a plurality of conducting means;
a capacitive switch coupled between at least a pair of said conducting means;
scanning means for sequentially interrogating the conducting means;
a capacitance detector sequentially coupled to said conducting means in synchronism with said scanning means for detecting capacitance associated with each said conducting means and
a reference capacitor coupled to said detector; and
means coupled to said detector for simultaneously charging and discharging said reference capacitor and the capacitance associated with an interrogated conductor for enabling said detector means to simultaneously compare the charge rate of said reference capacitor with the charge rate of the capacitance associated with an interrogated conducting means.

11. The capacitive switch system of claim 10 wherein said detector includes memory means for temporarily storing an indication of the capacitance value of an interrogated conducting means.

12. The capacitive switch system of claim 10 further including
storage means coupled to said capacitance detector for storing an indication of whether the capacitance associated with each said conducting means is greater or less than said reference capacitance.

13. The system according to claim 10 wherein said scanning means includes means to couple the said conducting means not then coupled to said detector to a reference potential.

14. The system according to claim 10 further including:
a unity gain amplifier having an input and an output;
said scanning means including means for coupling the input of said amplifier to said interrogated conducting means and the output of said amplifier to the said conducting means not then coupled to said detector.

15. The system according to claim 12 wherein
said storage means includes a bistable storage element associated with each said conducting means,
each said bistable element being in one state when the capacitance associated with its conducting means is greater than said reference capacitance and being in the other state when the capacitance associated with its conducting means is less than said reference capacitance.

16. The system according to claim 15 wherein
the states of said bistable elements constitute a 2 of N Code that identifies a selected one of said capacitive switches.

17. The system according to claim 16 further including an output lead associated with each of said capacitive switches; and
decode means coupled between said bistable elements and said output leads to actuate at least one of said output leads in accordance with the states of said bistable elements.

18. The method of determining whether any of a plurality of capacitive switches are actuated when each of the plurality of capacitive switches are coupled to a pair of unique conductors with each conductor being coupled to more than one capacitive switch, comprising the steps of:
sequentially coupling each of the conductors to a single capacitive detector that includes a reference capacitor,
simultaneously charging and discharging the reference capacitor and the capacitance of a conductor coupled to the detector with the capacitance of the conductor being greater than the reference capacitance when a switch coupled thereto is actuated and with the capacitance of the conductor being less than the reference capacitance when none of the switches coupled thereto are actuated; and
comparing the charge rate of the reference capacitor with the charge rate of the capacitance associated with the conductor coupled to the detector to determine whether the capacitance of the conductor coupled to the detector is greater or less than the reference capacitor.

19. The method of claim 18 further including the step of storing an indication of whether the capacitance associated with each of the conductors is greater or less than the reference capacitor.

20. The method of claim 19 further including the steps of repeating the sequential coupling of the conductors to the capacitance detector to determine the capacitance of said conductors; and determining whether the time interval during which the capacitance indications remain unchanged exceeds a predetermined minimum time.

21. The method of claim 19 further including the steps of determining whether the stored capacitance indications conform to a predetermined pattern that identifies an actuated capacitive switch.

22. The method of claim 20 further including the step of determining whether the number of stored capacitive indications constituting capacitances larger than the reference capacitor are more than a predetermined minimum number.

23. The system according to claim 1 wherein the number of unique pairs of conductors, or capacitive switches, (K) for a given number of conductor means (N) is defined by the equation $$K=(N-1)+(N-2)+(N-3)+\cdots(N-[N-1]).$$

* * * * *